United States Patent [19]

Asmussen et al.

[11] Patent Number: 4,507,588
[45] Date of Patent: Mar. 26, 1985

[54] ION GENERATING APPARATUS AND METHOD FOR THE USE THEREOF

[75] Inventors: Jes Asmussen, Okemos; Joseph J. Root, East Lansing, both of Mich.

[73] Assignee: Board of Trustees operating Michigan State University, East Lansing, Mich.

[21] Appl. No.: 468,897

[22] Filed: Feb. 23, 1983

[51] Int. Cl.³ .......................... H01J 7/46; H01J 19/80
[52] U.S. Cl. ................... 315/39; 315/111.41; 315/111.81; 313/231.31; 313/362.1; 219/121 PL; 250/423 R
[58] Field of Search ............... 315/39, 111.41, 111.81; 313/231.31, 362.1; 219/121 PL; 250/423

[56] References Cited

U.S. PATENT DOCUMENTS

| | | | |
|---|---|---|---|
| 3,022,236 | 2/1962 | Ulrich et al. | 315/39 X |
| 3,083,528 | 4/1963 | Brown | 315/39 X |
| 3,156,090 | 11/1964 | Kaufman | 60/35.5 |
| 3,418,206 | 12/1968 | Hall et al. | 315/39 X |
| 3,431,461 | 3/1969 | Dodo et al. | 315/39 |
| 3,541,372 | 11/1970 | Omura et al. | 315/39 X |
| 3,569,756 | 3/1971 | Reifenschweiler | 313/363.1 |
| 3,744,247 | 7/1973 | Margosian et al. | 60/202 |
| 3,778,656 | 12/1973 | Fremoit et al. | 313/362.1 |
| 3,866,414 | 2/1975 | Bahr | 315/39 |
| 3,937,917 | 2/1976 | Consoli | 219/121 P |
| 4,207,489 | 6/1980 | Camplan et al. | 313/363.1 |
| 4,298,798 | 11/1981 | Huffman | 250/423 R |
| 4,316,090 | 2/1982 | Sakudo et al. | 250/423 R |
| 4,339,691 | 7/1982 | Morimiya et al. | 315/111.41 |
| 4,393,333 | 7/1983 | Sakudo et al. | 315/111.41 |
| 4,409,520 | 10/1983 | Koike et al. | 315/111.41 |
| 4,417,178 | 11/1983 | Geller et al. | 315/111.41 |
| 4,438,368 | 3/1984 | Abe et al. | 315/111.41 |

OTHER PUBLICATIONS

Divergilio, W., MSU/NASA Workshop, East Lansing, MI, Feb. 24–25, 1982, (oral presentation contained in AIAA-82-1941).
Loeb, H. W., "State of the Art and Recent Developments of the Radio Frequency Ion Motors," AIAA Paper 69-285, Mar. 1969.
Noriyuki Sakudo, Katsumi Tokiguchi, Hidemi Koike, Ichiro Kanomata, "Microwave Ion Source", Review of Scientific Inst. 48, Jul. 7, 1977.
Nakanishi, S., MSU/NASA Workshop, East Lansing, MI, Feb. 24–25, 1982, (Oral presentation contained in AIAA-82-1937), Nov. 17–19, 1982.
Asmussen, J., et al., Proc. IEEE 62(1), 109–117, (1971).
Fredericks, R. M. et al., J. Appl. Phys. 42, 3647, (1971).
Messiaen, A. M. et al., Appl. Phys. Letters, 15, 30, (1969).
Fredericks, R. M. et al., Appl. Phys. Letters 19, 508, (1971).
Wood, R. W., Phys. Rev. 35, 673, (1930), Old Publication not available at present.
Taillet, J., "Plasmoides a'haute Frequence et Decharges Resonnantes", Rapport CEA-R. 2502 Centre des Etudes Muele' aires de Sac–lay, Firsur-Yvette, France, (1964).
Mallavarpu, R., et al., J. IEEE Trans. on Plasma Science PS-6, 341, (Dec. 1978).
Rogers, J. et al., 1982 IEEE International Conference on Plasma Science, Ottawa, Canada, May 17–19, 1982.
Rogers, J., Ph.D. Dissertation, Michigan State University, (1982).
Taillet, J., American Journal of Physics, vol. 37, No. 4, Apr. 1969, pp. 423–441.

*Primary Examiner*—Saxfield Chatmon
*Attorney, Agent, or Firm*—Ian C. McLeod

[57] ABSTRACT

A radio frequency wave ion generating apparatus which provides a thin disc shaped plasma adjacent an ion attracting means is described. The radio frequency waves are preferably microwaves. Several improvements to microwave plasma generation are described including the steps of generation of a resonantly sustained microwave discharge inside a microwave/plasma coupler or cavity (11) to ignite the plasma; probe (14) and length tuning of the microwave/plasma coupler by means of a sliding short (12) during operation of the plasma and minimization of the plasma volume inside the coupler in a chamber (15) to produce the disc plasma. The apparatus is particularly useful for internal ion or free radical irradiation of various materials provided in the plasma or for ion acceleration outside the cavity for use as an ion engine or as an ion source for irradiation of the materials.

18 Claims, 20 Drawing Figures

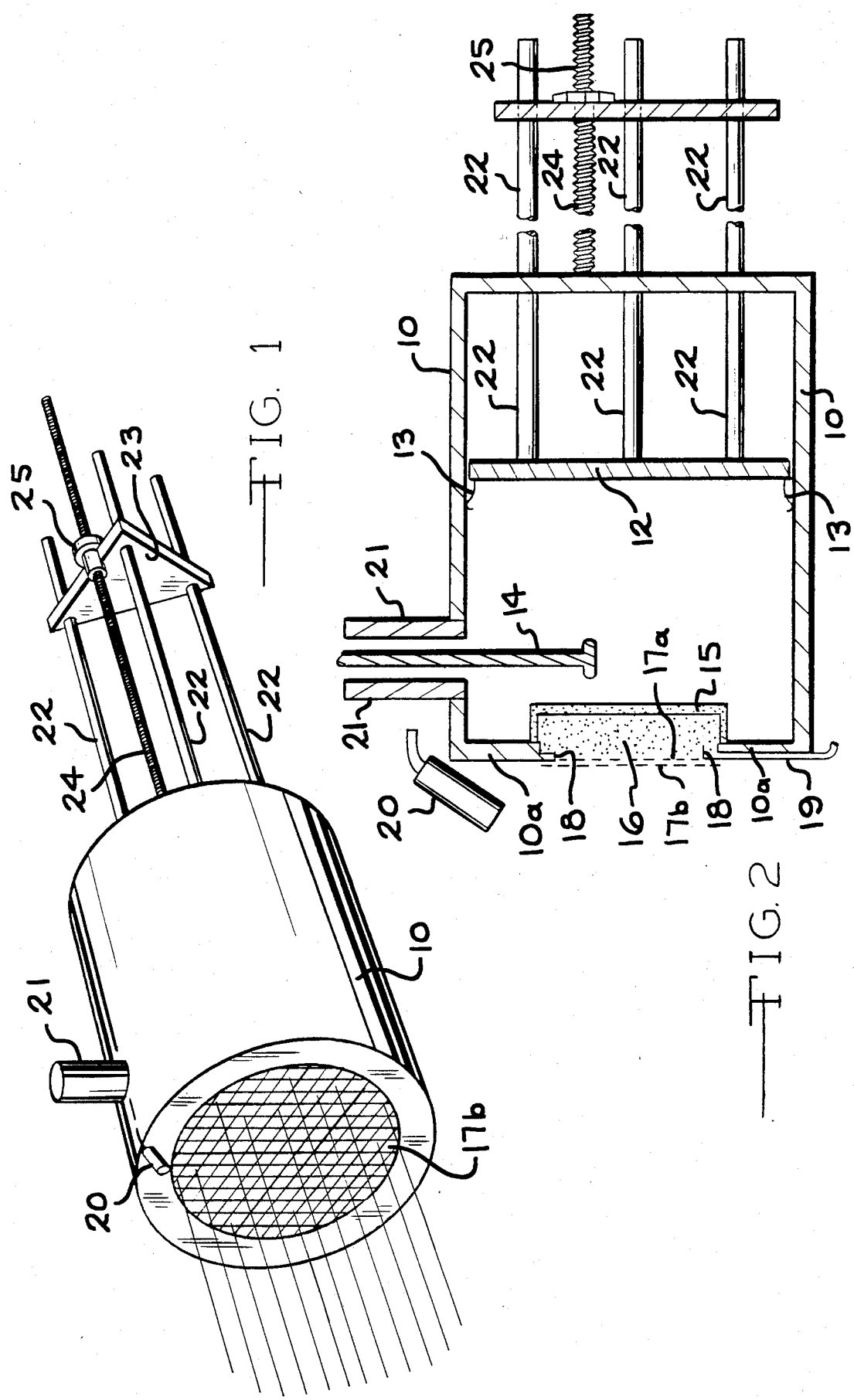

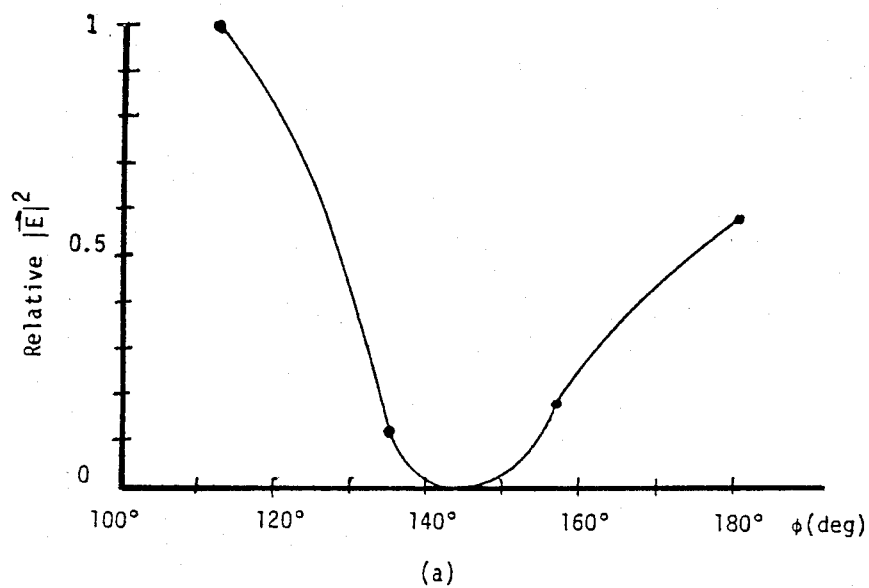
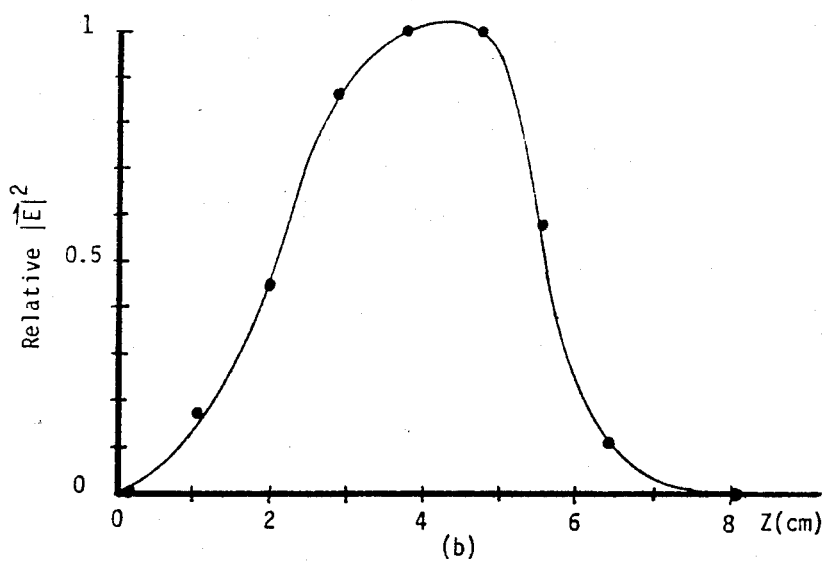
The TE$_{211}$ cavity mode field patterns with a plasma. The input power was 75.3W an environmental pressure of 4.2 x 10$^{-4}$T, and a flow rate of 26 sccm Ar. (a) Azimuthal field pattern, the excitation probe is located at $\phi$ = 90°. (b) The axial field pattern at $\phi$ = 180°, the excitation probe is at Z = 3.5 cm.
FIG. 10

Plots of I-V characteristics of the ion source operated in the $TE_{211}$ and $TM_{011}$ cavity modes.

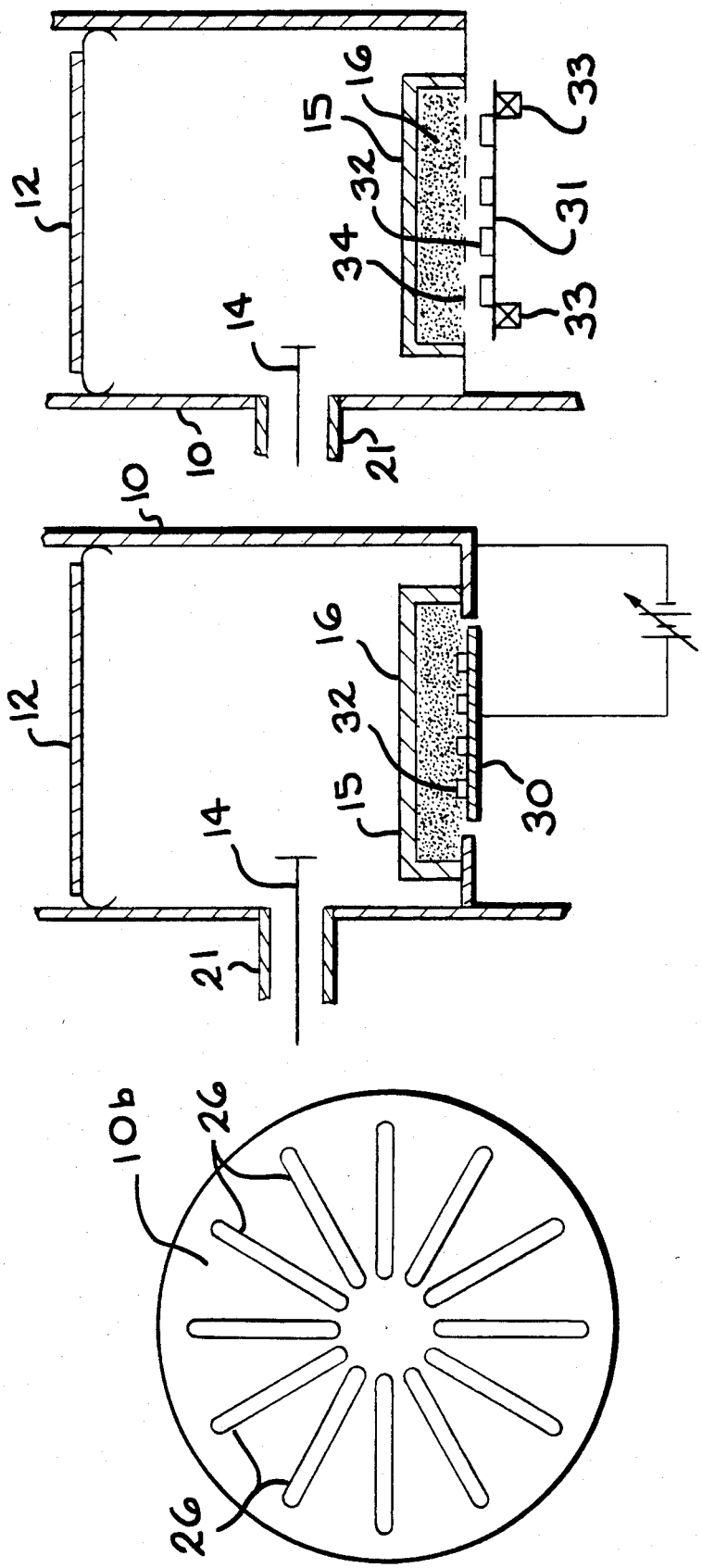

ION GENERATING APPARATUS AND METHOD FOR THE USE THEREOF

BACKGROUND OF THE INVENTION

1. Field of the Invention

The present invention relates to ion generating apparatus. In particular the present invention relates to ion generating apparatus utilizing a thin disk shaped plasma.

2. Prior Art

Recent ion engine research has focused on the use of time-varying (wave) electric energy or radio frequency waves, particularly microwave and UHF waves, for electric propulsion engines or other ion generating apparatus. Specific research projects presently being conducted involve utilizing rf (Divergilio, W., MSU/NASA Workshop, East Lansing, Mich. Feb. 24-25, 1982) Loeb, H. W., "State of the Art and Recent Developments of the Radio Frequency Ion Motors," AIAA Paper 69-285 March 1969; Noriyuki Sakudo, Katsumi Tokiguchi, Hidemi Koike, Ichiro Kanomata, "Microwave Ion Source", Review of Scientific Inst. 48, July 7, 1977; VHF (Nakanishi, S., MSU/NASA Workshop, East Lansing, Mich., Feb. 24-25, 1982) and microwave (Divergilio, W., MSU/NASA Workshop on Advanced Propulsion Concepts Using Time Varying Electromagnetic Fields, East Lansing, Mich., Feb. 24-25, 1982) electric energy sources. These engine concepts possess certain advantages over the more conventional well-developed direct current ion source apparatus. For example, time varying electric ion sources appear to (1) improve overall system efficiency (low eV/ion); (2) allow high ion beam densities when accelerated; (3) yield longer life engines due to the absence of metal cathodes in the discharge region; and (4) result in simplified overall system design. The same apparatus can also used for free radical or ion irradiation of various materials rather than as ion engines. In each instance the radio frequency wave apparatus are complex.

Objects

It is therefore an object of the present invention to provide a large diameter ion beam generating or ion with a minimal plasma volume source apparatus wherein a plasma is formed as a thin disk adjacent an ion attracting means, such as a metallic negatively charged accelerator grid alone or in combination with a screen grid. It is further an object of the present invention to provide efficient microwave or rf power coupling even without a magnetic field. It is further an object of the present invention to provide an ion or free radical generating apparatus which is relatively simple and inexpensive to construct. These and other objects will become increasingly apparent by reference to the following description and to the drawings.

IN THE DRAWINGS

FIG. 1 is a schematic isometric view of the preferred ion engine of the present invention.

FIG. 2 is a front cross-sectional view of FIG. 1, particularly illustrating the construction of the ion engine using a chamber (15) for forming the disk shaped plasma.

FIG. 9a shows an ion neutralizer (20) circuit which generates electrons from a metal wire (501).

FIGS. 10a and 10b show graphs of TE field patterns with a plasma.

Figure 12:
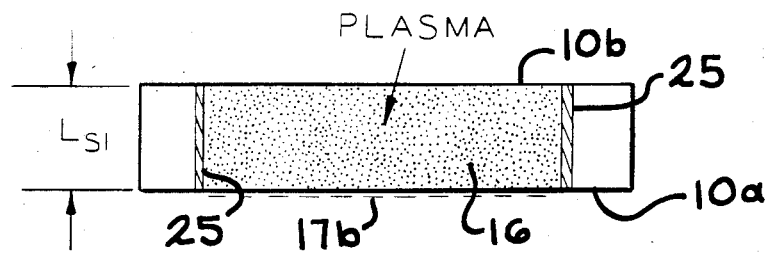
Figure 12A:
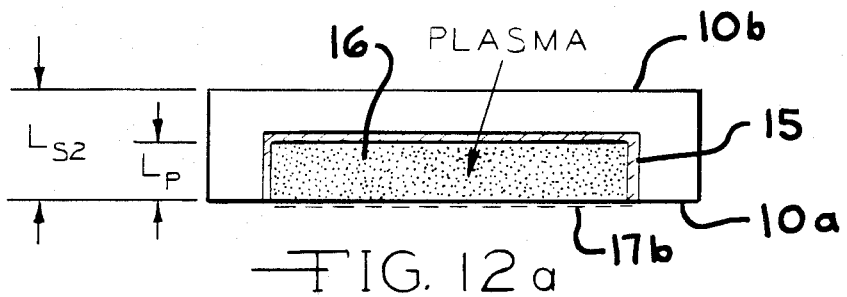

FIG. 12 schematically shows an alternate open chamber (25), fixed length cavity $TM_{010}$ mode (rather than closed chamber (15) as in FIGS. 2 and 12a) of the ion generating apparatus of the present invention.

Figure 13:
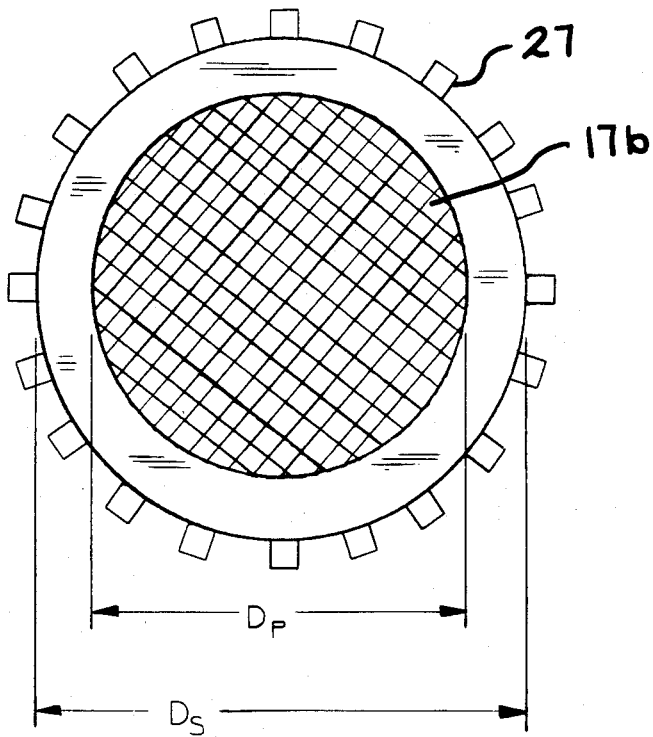

FIGS. 13 and 14 show front and back schematic views, respectively of the ion source apparatus of the present invention, wherein bar magnets (26, 27) are used to form magnetic cusps to aid in confining the plasma ions in the chamber (15 or 25).

FIGS. 15 and 16 are schematic front cross-sectional views showing ion generating apparatus for ion and free radical plasma etching of various materials (32).

GENERAL DESCRIPTION

The present invention relates to an ion generating apparatus including a plasma source employing a radio frequency wave coupler, particularly a cavity (11), which is excited in one or more of its TE or TM modes of resonance and optionally including a magnetic field which aids in confining the ions in the coupler and including ion attracting means (17b) for attracting the ions from said plasma, preferably by means of a suitable voltage potential which accelerates the ions, the improvement which comprises:

(a) an electrically insulated plasma defining chamber (15) mounted in closely spaced relationship to an area (16) of a metallic radio frequency coupler;

(b) at least one metallic ion attracting means (17b) mounted adjacent to and electrically insulated from the insulated chamber which forms part of the radio frequency waver coupler; and (c) gas supply means (18, 19) for providing a gas which is ionized to form the plasma in the plasma defining chamber, wherein the radio frequency wave resonance applied to the coupler and plasma maintains the plasma in the shape of an elongate, thin disk adjacent to the ion attracting means during steady state operation of the apparatus.

The present invention also relates to the method which comprises providing an ion generating apparatus including a plasma source employing a radio frequency wave coupler, particularly a cavity (11), which is excited in one or more of its TE or TM modes of resonance and optionally including a magnetic field which aids in confining the ions in the coupler and including ion attracting means (17b) for attracting the ions from said plasma by means of a suitable voltage potential which accelerates the ions, wherein the plasma, and ion attracting means are maintained at a reduced pressure in operation, wherein the ion source apparatus includes the improvements of: (1) an electrically insulated plasma defining chamber (15) mounted in a closely spaced relationship to an area (16) of a metallic radio frequency wave coupler; (2) at least one ion attracting means (17b) mounted adjacent to and insulated from the insulated chamber which forms part of the radio frequency wave coupler; and (3) gas supply means (18, 19) for providing a gas which is conveyed to form the plasma in the insulated chamber;

(b) forming the plasma in the chamber with the radio frequency wave at elevated gas pressures below atmospheric pressures and at elevated gas flow rates from the supply means;

(c) reducing the gas pressure and the flow rate of the gas into the chamber to provide a plasma disk adjacent the ion attracting means; and (d) attracting ions with the ion attracting means.

The present invention is particularly concerned with microwaves in the range of about 1000–3000 megahertz and UHF down to about 300 megahertz. VHF can also be used below 300 megahertz to about 200 megahertz. In the following description the reference will be to microwaves which are preferred.

The plasma disk, ion generation apparatus of the present invention includes several important improvements to microwave plasma systems. They are: (1) generation of a resonantly sustained microwave discharge inside an area or part of microwave/plasma coupler or cavity; (2) probe and length tuning of the microwave/plasma coupler to efficiently create the plasma in the area; and (3) minimization of plasma volume in the cavity. The microwave discharge fills only part of the coupler. The plasma and the external metallic coupler, usually a microwave cavity, combine to form a resonant circuit. Probe and length tuning of the microwave/plasma coupler provide the variable impedance transformation (Asmussen, J., R. Mallavarpu, J. R. Hamann, and H. C. Park, Proc. IEEE 62(1), 109–117 (1974); Fredericks, R. M. and J. Asmussen, J. Appl. Phys. 42, 3647 (1971)) required to adjust for zero reflected power and achieve variable operation over a wide range of pressure and microwave input powers.

The discharges generated in microwave cavities at low pressure are often called resonantly sustained discharges (Messiaen, A. M. and P. E. Vandenplas, Appl. Phys. Letters, 15, 30 (1969), Fredericks, R. M. and J. Asmussen, Appl. Phys. Letters 19, 508 (1971)) or plasmoids because they are similar to the lower frequency rf plasmoids studied by Wood (Wood, R. W., Phys. Rev. 35, 673 (1930)) and Tallet (Tallet, J., "Plasmoides a'- haute Frequence et Descharges Resonnantes," Rapport CEA-R. 2502 Centre des Etudes Muele'aires de Saclay, Gifsur-Yvette, France (1964)). Microwave discharges created in this manner have densities greater than the critical density. For example, electron densities of $10^{12}/cm^3$ or more can be achieved with exciting frequencies of 2.45–30 GHz (Fredericks, R. M. and J. Asmussen, Appl. Phys. Letters 19, 508 (1971); Mallavarpu, R., J. Asmussen and M. C. Hawley, IEEE Trans. on Plasma Science PS-6, 341 (December 1978); J. Rogers and J. Asmussen, 1982 IEEE international conference on Plasma Science, Ottawa, Canada, May 17–19, 1982; J. Rogers, Ph.D. Dissertation, Michigan State University, 1982). At reduced pressures (<50 microns) of mercury where the mean free path of ions is comparable to the size of the discharge vessel, measurements have shown that the effective collision frequency, $\nu_e$, is (1) higher than similar microwave discharges in larger vessels and (2) higher than predicted by simple electron neutral collisions. These "high" collision frequencies together with high plasma densities provide the power coupling mechanism to sustain the discharge at the low pressures ($1 \times 10^{-4}$ torr) required for the ion source application.

Specific Description

FIGS. 1 and 2 show the preferred ion source of the present invention. The principle components of the ion source are displayed in the cross-sectional view of FIG. 2. The system consists of a 17.8 cm inside diameter brass cylinder walls 10 forming the microwave cavity 11. A sliding short 12, with brushes 13 contacts cylinder 10 and the adjustable excitation probe 14, provide the impedance tuning required to minimize reflected power. The sliding short 12 can be moved back and forth along the longitudinal axis of the cavity 11 to adjust its electrical length while the radial penetration of the excitation probe 14 into the cylinder walls 10 varies the cavity 11 mode coupling. A quartz dish 15 is shaped like a petri dish and keeps the working gas in region 16 while allowing the microwave power to produce a disk-like plasma adjacent to the extraction grids 17a and 17b. The working gas is introduced into region 16 by means of an annular ring 18, supplied by gas feed tube 19. The ion attracting means 17 are conventional 8 cm ion extraction grids 17a and 17b which extract the ions from the microwave plasma. The first grid 17a (the screen or microwave coupling grid) is electrically connected to the cavity end plate 10a while the second grid 17b (accelerating grid) is placed about 1 mm from the screen grid 17a. A heated tungsten filament neutralizer 20 is placed downstream from the grids 17a and 17b to provide the neutralizing electrons for the ion beam. A conduit 21 is provided as a microwave inlet port to the cavity 11 for probe 14. The short 12 is adjusted by means of rods 22 supported by plate 23 outside the cylinder walls 10 controlled by threaded post 24 and nut 25.

The ion source minimizes the plasma volume by creating a thin disk-like plasma adjacent to the extraction grids 17a and 17b. The ions in the disk plasma and the grids 17a and 17b form part of a resonant microwave cavity. The plasma is created by exciting the cavity in one of several modes. For example, the $TM_{010}$, $TM_{011}$, $TE_{111}$ and $TE_{211}$ cavity modes create and maintain a plasma disk. The field patterns for these modes are displayed in FIGS. 3, 3a, 4, 4a, 5 and 5a. Note that the $TE_{111}$ and $TE_{211}$ modes have fields that are tangential to the flat disk plasma surface, while the TM modes produce a field that is perpendicular to and a maximum at the flat disk surface. Thus, the TM modes appear to be the most promising, efficient low pressure modes.

Associated Systems

Figure 3A:
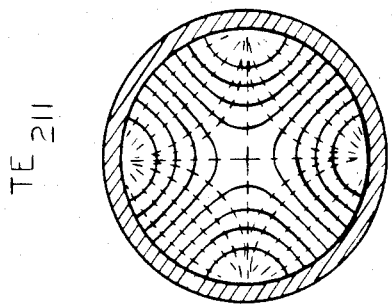
FIGS. 3, 3a, 4, 4a, 5 and 5a are front cross-sectional and plan cross-sectional views of various TM or TE empty cavity (11) microwave modes used in the apparatus of the present invention.
Figure 3:
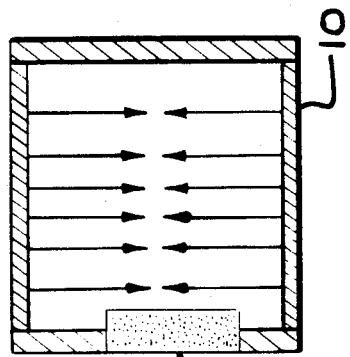
Figure 4A:
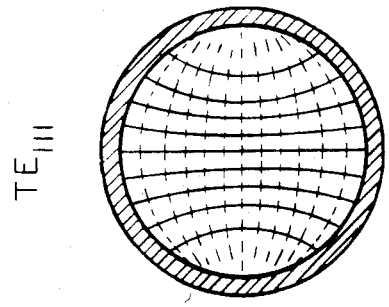
Figure 4:
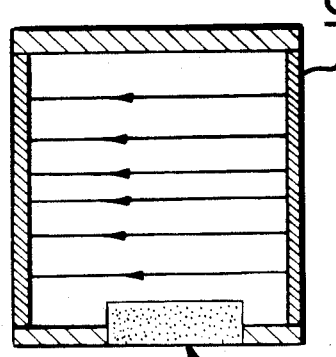
Figure 5A:
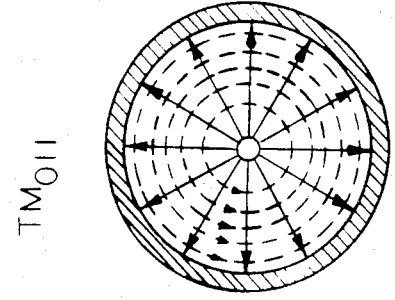
Figure 5:
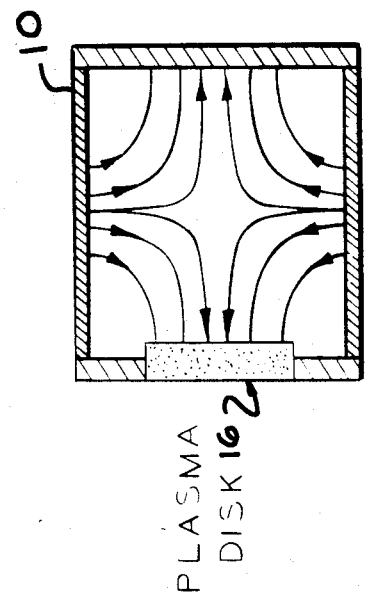
Figure 6:
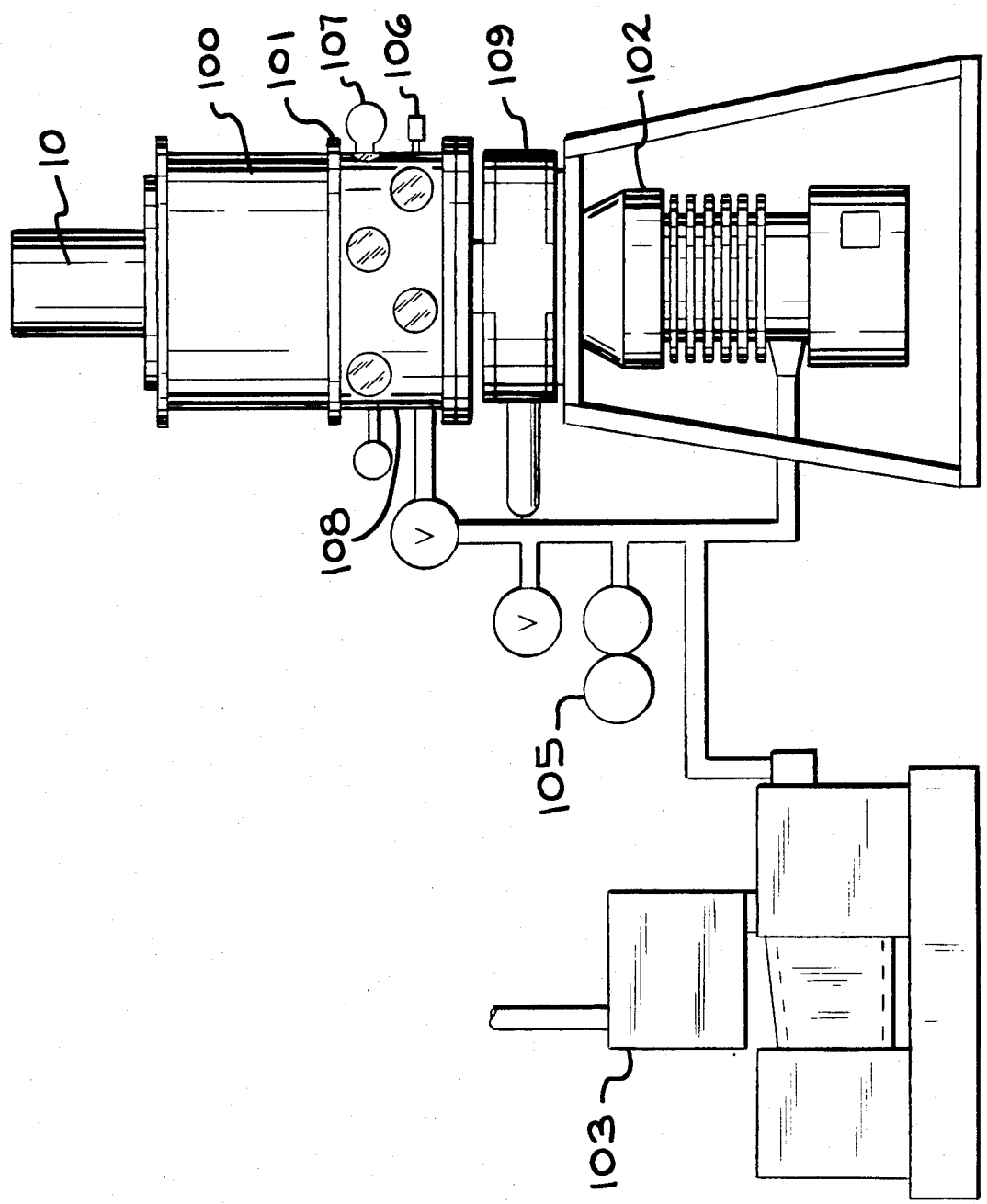
FIG. 6 is a schematic view of the attached vacuum system (102, 103) used with the ion generating apparatus shown in FIG. 2.
Figure 7:
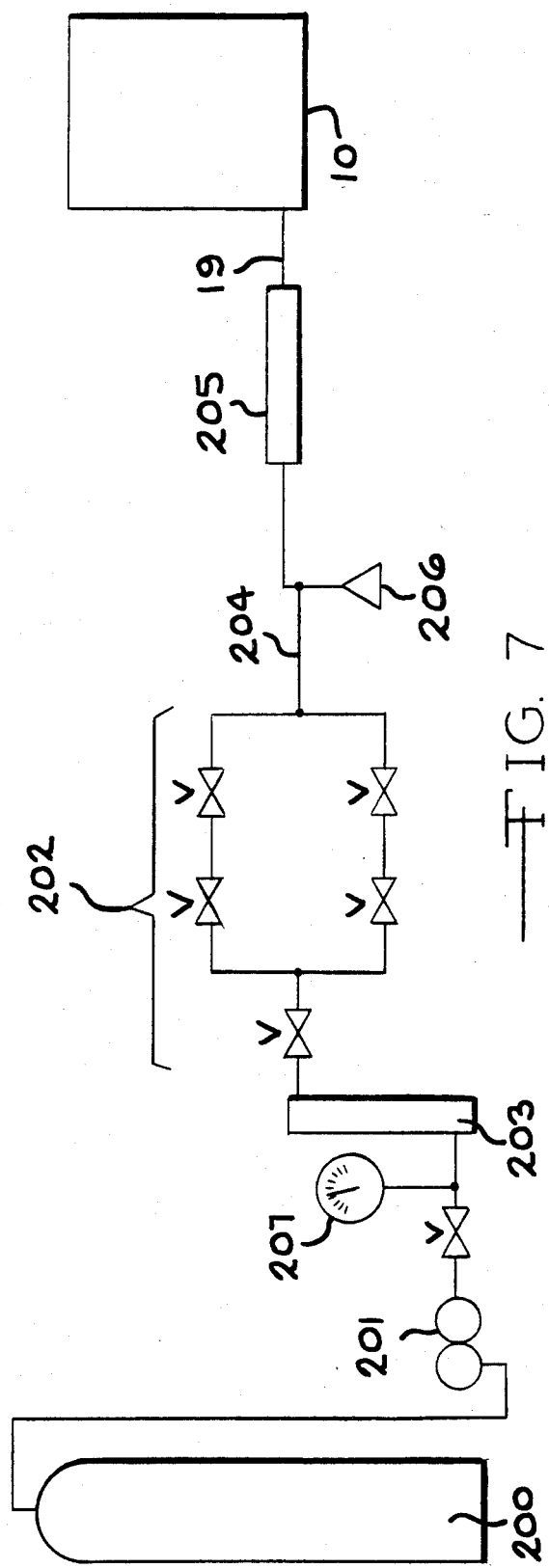
FIG. 7 is a schematic view of the preferred argon gas flow system to the chamber (15) in the apparatus of FIG. 2.

Schematic diagrams of the vacuum/input gas flow and microwave/electrical systems are shown in FIGS. 6 and 7 respectively. As shown in FIG. 6, the cylinder walls 10 are positioned with the chamber 15 located on top of and adjacent to a 45.7 cm radius by 45.7 cm cylindrical bell jar 100 by means of a plexiglass plate 104. The jar 100 can pumped down to $10^{-6}$ Torr by the diffusion pump 102 and roughing pump 103. A thermocouple 105, pressure gauge 106 and ion gauge 107 were provided as is conventional. The jar 100 was mounted on a metal tank 108. A gate valve 109 was provided for the diffusion pump 102 in a known manner. Argon gas flow was regulated from the input feed tank 200 with a pressure regulator 201 and control valves 202 and was measured with a calibrated rotometer 203. Argon gas entered the plasma disk in the chamber 15 through holes in the annular ring 18. This ring 18 was connected to the feed rotometer 201 via copper tubing 204 and a short section of quartz tubing 205 which allowed electrical isolation from ground potential. Thermocouple pressure gauge 206 provided pressure measurement. Back pressure was measured with gauge 207. Argon gas flow rate from tank 200 and vacuum chamber pressure from diffusion pump 102 and roughing pump 103 apparatus were not independent in this system since argon gas was not bled into the vacuum system below the ion source outside of chamber 15.

Figure 8:
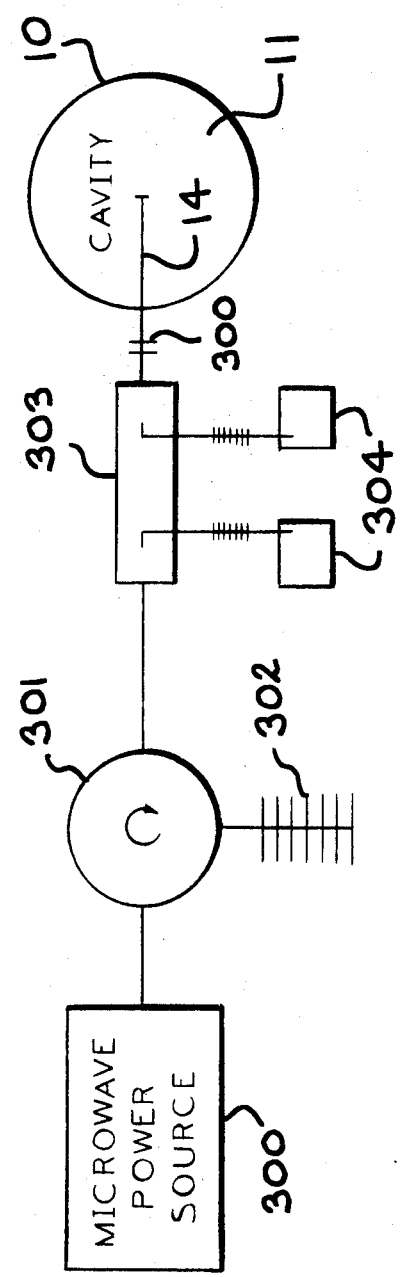
FIG. 8 is a diagram of the microwave circuitry for supplying the microwaves to cavity (11) in the apparatus of FIG. 2.
Figure 9:
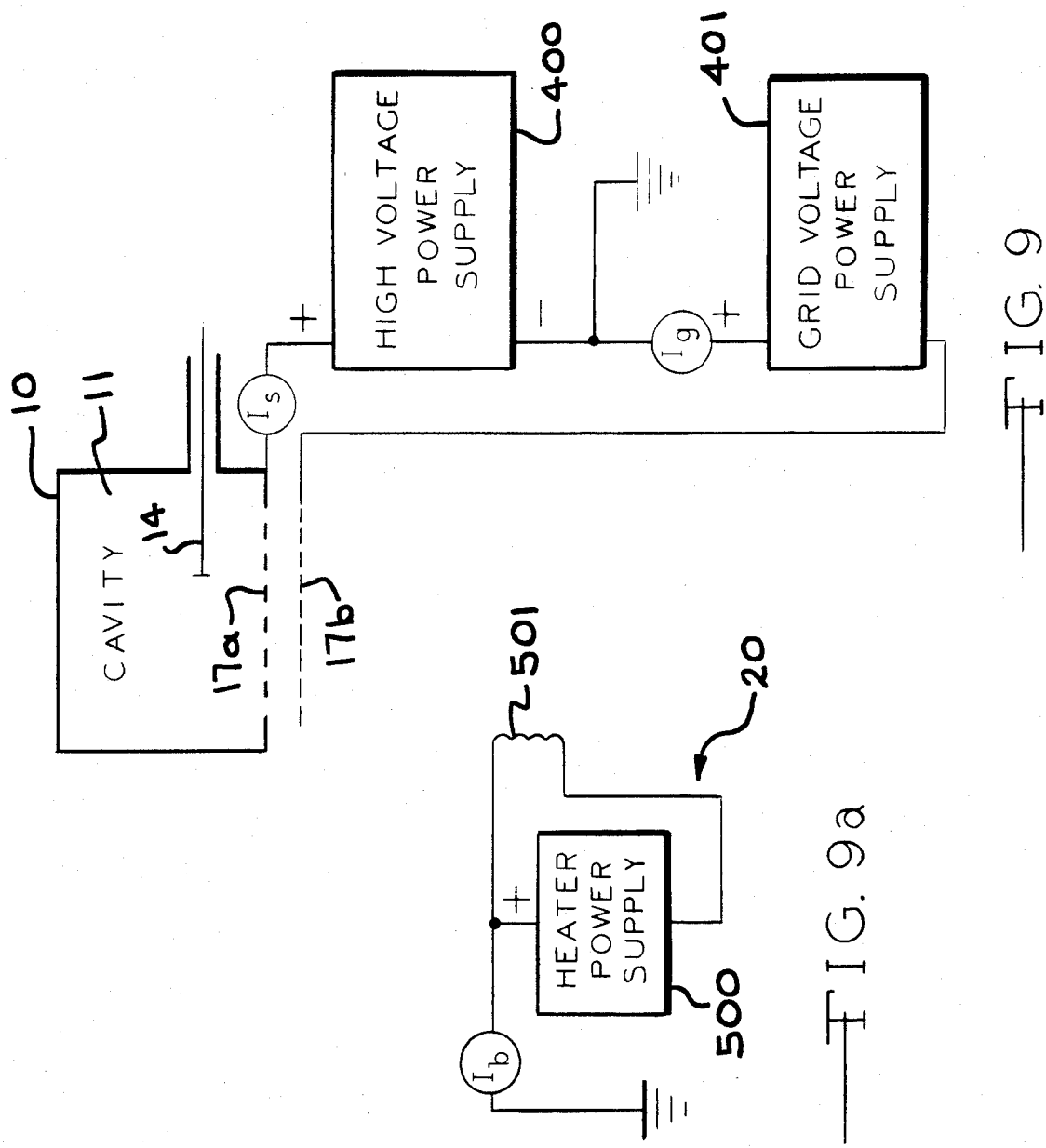
FIG. 9 is a diagram of the ion extraction circuit of the present invention particularly showing the use of a screen grid (17a) and an accelerator grid (17b) as shown in FIG. 2.

The microwave system, shown in FIG. 8, consisted of a continuously variable 0–150 W, CW, 2.45 GHz oscillator 300, three port circulator 301, matched load 302, and directional coupler 303 and power meters 304 to measure incident, $P_i$, and reflected power $P_r$. A radial choke 305 was placed on the outside of the coaxial cavity 11 which provided the the dc isolation from ground potential required for the application of grid 17$b$ voltages. As shown in FIG. 9, the dc biasing circuits consisted of the usual screen 17$a$ and accelerating grid 17$b$ connected to dc power supplies 400 and 401. FIG. 10 shows a hot tungsten wire 501 and circuit 500 for the neutralizer 20. In order to insure discharge stability at low pressures the oscillator (300) may be frequency stabilized with a phase-locked loop in a known manner.

To ignite the plasma it was necessary to bring the environmental pressure in the bell jar 100 up to approximately 300 to 400 microns of Hg. The incident microwave power was set in the neighborhood of 60 W. The cavity 11 was then tuned to a given cavity 11 mode by adjusting the short 12 length and the probe 14 depth until a match was attained, i.e., the reflected power was zero. The plasma generally goes on when there is a match, however, occasionally a Tesla coil was used to ignite the plasma.

To reach the operational pressures and flow rates for a given use the plasma was ignited by the procedure outlined above; then the pressure was reduced by cutting back on the flow rate from the tank 200. This was done in steps so that the cavity 11 could be retuned to a match for the particular cavity 11 mode and chamber 15 pressure. In this manner, the environmental pressure in chamber 15 was lowered to the operating pressure while maintaining a match between the microwave/cavity 11 system and the microwave power system.

Results

Preliminary experiments were performed to develop an understanding of the microwave ion source behavior. All experiments utilized a quartz disk chamber 15 of 9.42 cm inside diameter and 5.1 mm depth forming a plasma of equal diameter and depth of 1.47 cm. The results of these experiments are summarized below:

1. Electromagnetic mode excitation. A microwave plasma disk was ignited and maintained with the $TE_{211}$ and $TM_{011}$ modes. Both modes have demonstrated matched ($P_r$ (reflected power) approximately equal to 0.05 $P_i$ (incident power)) operation in argon gas down to vacuum chamber pressures of about $1 \times 10^{-4}$ Torr and flow rates of about 20 sccm argon. In each of these modes, the plasma fills the disk 15 and is in contact with the grids 17$a$ and 17$b$ at all pressure below 100 microns when absorbed powers are 40–80 watts. At higher pressure or lower absorbed power levels, the disk plasma partially fills the chamber 15 taking on shapes that are related to the electromagnetic exciting fields.

Usually the plasma was ignited at a high flow rate and vacuum chamber pressures of about 300 microns of mercury. After the ignition, the vacuum system was gradually pumped by pumps 120 and 103 down to lower pressures while small changes in cavity 11 length using short 12 and probe 14 tuning were made to minimize the reflected power. Reflected power could always be adjusted to less than 5% of the incident power. The lower pressure limit of about $1 \times 10^{-4}$ Torr for the system operation was determined by experimental vacuum valve (v) sensitivity. Lower flow rates and pressures can be obtained with new valves.

2. Electron density. Electron density measurements were not performed in the present experimental system. However, the general operation of the plasma vs. power is similar to that observed in other microwave experiments (Mallavarpu, R., J. Asmussen, and M. C. Hawley, IEEE Trans. on Plasma Science PS-6, 341 (December 1978); where density measurements were performed. Thus it is expected that plasma electron densities in the plasma disk are similar to those measured earlier i.e, the densities are equal to or greater than $10^{11}/cm^3$ required for ion source operation.

3. Coupling Efficiency and Loaded Cavity Q

Cavity 11 electromagnetic fields were measured by inserting small diagnostic coaxial probes (not shown) into the cavity. The $TE_{211}$ mode fields were measured by inserting coaxial probes (not shown) into a number of holes equally spaced along the cavity 11 axis and equally spaced along the cylindrical cavity 11 azimuthal angle. These probes were connected to a power meter (not shown) providing a measurement of the square of the radial electric field adjacent to the cavity 11 walls 10. Measurements were made with and without the plasma. A typical measured $TE_{211}$ field pattern with a plasma present is shown in FIG. 10.

The coaxial probes also allow the following measurements and calculations to be performed. (1) the coupling efficiency to the discharge, (2) cavity Q with the plasma present, (3) the power lost to the walls 10, and (4) absorbed microwave power density $<P>$, in the plasma disk. Table 1 shows measured and calculated characteristics for the $TE_{211}$ mode together with the important plasma/cavity definitions.

TABLE 1

Characteristics of the Plasma Cavity System:
$TE_{211}$ mode, $P_t = 75$ W, $Q_u = 1240$,
chamber pressure $4.2 \times 10^{-4}$ Torr, flow rate
26 sccm of Ar

| $P_t$ | $P_c$ | Coupling Eff | $Q_u$ | $<P>$ |
|---|---|---|---|---|
| 75 W | 13.5 W | .82 | 223 | 0.6 W/cm$^3$ |

Definitions
$P_t$ = total measured power absorbed in the plasma/cavity $P_i - P_r$
$P_c$ = power lost in cavity walls
$P_p = P_t - P_c$ = power absorbed in the plasma volume
V = plasma volume
$Q_u$ = unloaded Q of the cavity system with the plasma present
$Q_{uo}$ = unloaded Q of the cavity system without the plasma Coupling Eff = $\frac{P_p}{P_t} = \frac{P_t - P_c}{P_i - P_r}$ $<P> = \frac{P_p}{V}$ = discharge power density The measurements indicate that 13.5 W of the 75 W coupled into the cavity 11 is lost in the conducting walls 10 and the quartz disk chamber 15 yielding a 82% coupling efficiency. Over sixty watts of power is absorbed by the plasma resulting in a discharge power density of 0.6 W/cm$^3$. Coupling efficiency can be improved 5-10% with lower loss quartz materials and improved cavity construction.

4. I-V Characteristics and Efficiencies

Common measures of the efficiency of D.C. ion engines are the ion production cost measured in W/(beam amp) and the mass utilization which is a measure of the fraction of the incoming gas that is used in the ion beam. The ion production cost will be given two ways. First by:

$$e_t = P_t/I_g(1200 \text{ v}),$$

where $I_g(1200 \text{ v})$ is the extrapolated grid current. Thus, $e_t$ is a measure of the power going into the cavity 11 to produce the extrapolated grid current at 1200 v. Secondly, by, $$e_p = p_p/I_g(1200 \text{ v}).$$

This is a measure of the power going into the plasma to produce the extrapolated grid current at 1200 v.

The mass utilization efficiency is given by $$e_{mu} = \frac{I_g(1200 \text{ v})}{\left(6.66 \times 10^{-2} \frac{A}{\text{sccm Ar}}\right) f(\text{sccm Ar})}$$

where f is the flow rate of the argon gas in units of sccm Ar.

Figure 11:
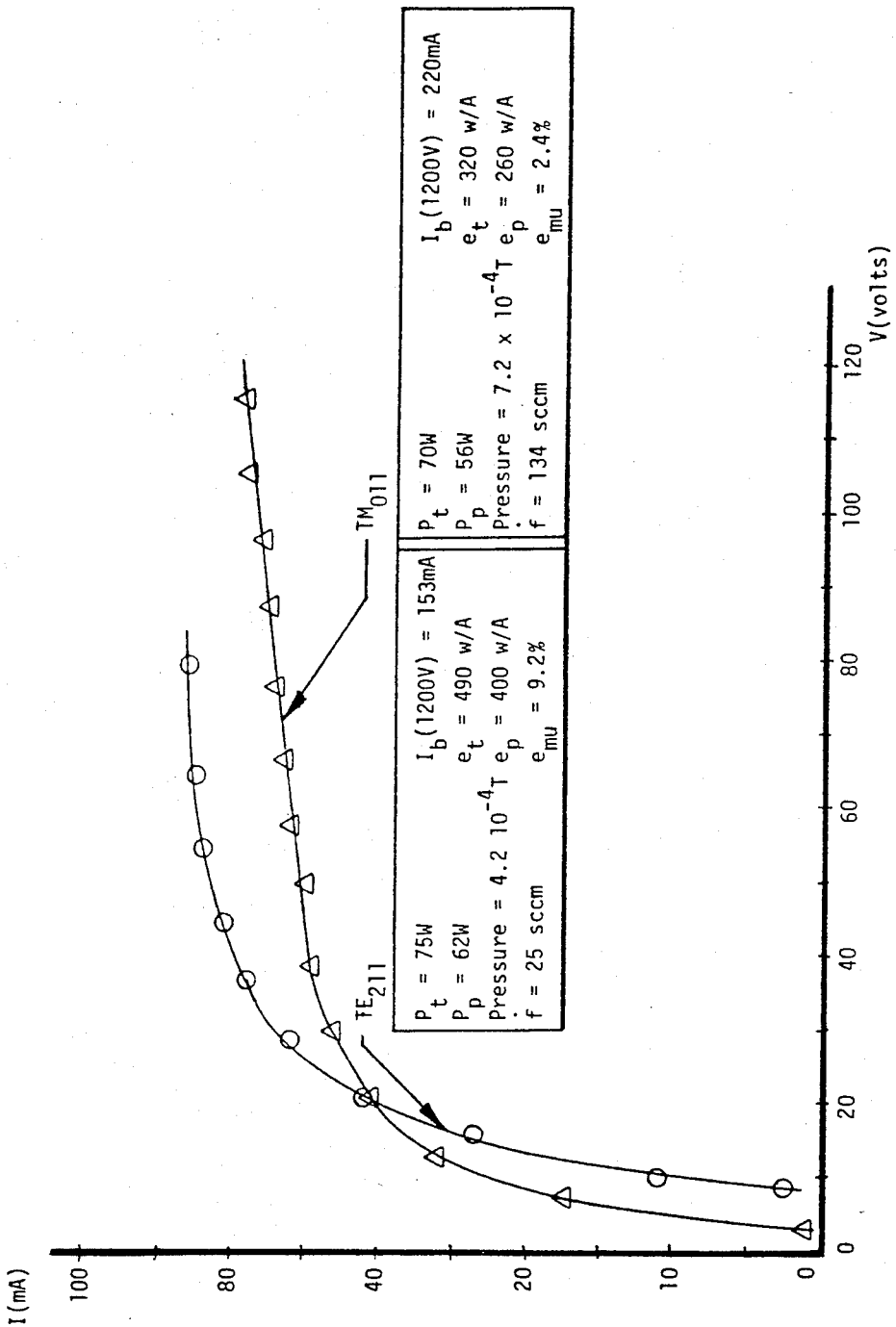
FIG. 11 shows characteristics of the ion source operated in the $TE_{211}$ and $TM_{011}$ cavity modes.

The extrapolated grid 17b currents at 1200 v were obtained by measuring the I-V characteristics of the ion source out to a screen grid 17a voltage of 80 v or more where the I-V curve saturates with a constant slope. The measurement of the I-V characteristics were taken by increasing the screen grid 17a voltage while holding the grid 17b voltage at zero (see FIG. 10) and measuring the ion current to the acceleration grid 17b. Typical I-V characteristics for this ion source are shown in FIG. 11 for operation in both the TE$_{211}$ and TM$_{011}$ modes.

The I-V characteristics of the ion source rises quickly and then saturates to a line of constant slope which rises slowly for increasing voltage. The grid 17b current at 1200 v was obtained by extending this line out to 1200 v. This is the $I_g(1200 \text{ v})$ used in evaluating $e_t$, $e_p$, and $e_{mu}$. The efficiencies found in this way for this ion source are listed in FIG. 11 for both the TE$_{211}$ and the TM$_{011}$ modes.

Conclusions

It has been demonstrated that a microwave "disk like" plasma can be sustained adjacent to the grids 17a and 17b with either TE or TM cavity 11 modes at pressures below $2 \times 10^{-4}$ Torr. The microwave plasma was generated and maintained using 10-100 W of CW, 2.45 GHz power with little, if any, reflected power. Measurements of microwave coupling efficiency have shown that over 80% of the power absorbed in the cavity 11 is coupled into the plasma. Grid 17a and 17b current measurements indicate discharge efficiencies that compare favorably with other 8 cm ion engines, a surprising result since the present system of FIGS. 1 and 2 does not employ cusp magnetic fields to reduce diffusion to the disk walls. However, sputtering of grid 17a and 17b material onto the quartz disk has been identified as a potential operating problem. This was solved by glass coating the accelerating grid 17b. It will also be appreciated that a single accelerating grid 17b can be used without the screen grid 17a.

The previously described results suggested a number of changes that can improve the system efficiency (W/beam amp) as shown in FIGS. 12, 12a, 13 and 14. For example, a disk ion source operating in the length independent TM$_{010}$ mode would allow the cavity 11 end plate 10a to be placed next to the fixed flat face 10b as shown in FIGS. 12 and 12a rather than using a variable cavity 11 with short 12 as shown in FIG. 2. This end plate 10b provides a surface to mount magnets 26 that produce cusp magnetic fields required to reduce the ion diffusion from quartz chamber 15 or 25. Magnets 27 provide additional ion confinement in chamber 15 or 25. Operating this system at 500 to 1,000 MHz, would allow the scaling up to a 30 cm ion engine and further improve the microwave coupling efficiency.

Thus for instance when $f_o = 500$ MHz
$D_p = 30$ cm
$D_s = 50$ cm
$L_{s1} = 10$-20 cm
$L_{s2} = 44$ cm
$L_p = 3$-4 cm In FIGS. 15 and 16 apparatus are shown for ion, and free radical plasma etching. In each instance a plate 30 or 31 supports the wafers 32 or material to be treated. Heaters 33 can be used to heat the plate 31. The screen 34 or plate 30 attracts the ions.

In FIG. 15, the wafers 32 are placed on a conducting tray 30 that can be inserted into the plasma allowing the wafers 32 to be in direct contact with the plasma. Different dc potentials can be placed on the conducting tray 30 to vary the plasma sheath potential.

In FIG. 16, the perforated aluminum screen grid 34 separates the reactor into two regions. In the plasma region, ionization and the formation of the free radicals takes place. The screen 34 prevents the ions from flowing out of plasma volume and also shields the wafers 32 from microwave radiation. The free radicals pass through the screen onto the wafers 32 on work stage 31 where the etching takes place.

The two examples shown in FIGS. 15 and 16 utilize the following:
(1) the microwave cavity is excited in one or several TE or TM modes; i.e. they use the same basic coupling technique used in the microwave plasma ion source;
(2) radical gas input feed (similar to the ion source) as in FIG. 2;
(3) the size of the plasma disk can be changed by changing cavity size and excitation frequency; and
(4) If desired cusp magnetic fields can be added as shown in FIGS. 13 and 14.

The present invention relies upon the fact that once a gas is ionized it becomes part of the microwave resonant circuit. Thus in the steady state of the apparatus the grid(s) or other metallic ion attracting means and the plasma disk provides one plate and the sliding short 12 forms the other microwave reflecting member such that a thin plasma can be generated adjacent to the ion attracting means by cavity resonance. The chamber 15 or 25 provides start up confinement of the gas to be ionized. The sliding short 12 and end plate 10a and the grids 17b, 34 or plate 30 provide the initial microwave resonance which ignites the plasma and then the coupler and plasma are tuned into resonance by adjusting the sliding short 12 and the coupling probe 14. By varying the input power, sliding short 12 and coupling probe 14, the plasma properties such as electron density and electric field can be controlled while still yielding a matched ($P_r \cong 0$) plasma/coupler system. It is this method and apparatus which has not been described by the prior art.

Numerous variations will occur to those skilled in the art. The basic concept of the present invention is the use of a plasma disk as described.

We claim:

1. In an ion generating apparatus including a plasma source employing a radio frequency wave coupler which is excited in one or more of its TE or TM modes of resonance to produce the plasma in the coupler and optionally including a static magnetic field which aids in confining the ions in the coupler including a probe inside the coupler which couples the radio frequency waves to the coupler and including ion attracting means for attracting the ions from said plasma preferably by means of a suitable voltage potential which accelerates the ions, the improvement which comprises:
    (a) an electrically insulated plasma defining chamber (15) having a central longitudinal axis and mounted in closely spaced relationship to an area (16) of a metallic radio frequency wave coupler which is in the shape of a hollow cavity (11);
    (b) at least one metallic ion attracting means (17a) mounted adjacent to and electrically insulated from the insulated chamber which ion attracting means forms part of the radio frequency coupler;
    (c) gas supply means (18, 19) for providing a gas which is ionized to form the plasma in the plasma defining chamber, wherein the radio frequency wave applied to the coupler creates and then maintains the plasma in the shape of an elongate, thin disk adjacent to the ion attracting means and perpendicular and surrounding to the axis in the chamber during steady state operation of the apparatus; and
    (d) movable metal plate means (12) in the cavity mounted perpendicular to the axis and movable towards and away from the plasma disk; and
    (e) a movable probe (14) connected to and extending inside the coupler for coupling the radio frequency waves to the coupler wherein movement of the plate means and the probe in the coupler achieves a selected TE or TM mode of resonance of the radio frequency wave in the coupler and varies the resonance of the mode.

2. The ion generating apparatus of claim 1 wherein the attracting means is a plate means (30) mounted inside the chamber such that ions attracted to the plate adjacent to the plasma.

3. The ion generating apparatus of claim 1 wherein the metallic ion attracing means is a grid means (17b, 34).

4. In an ion source apparatus including a plasma source employing a microwave cavity (11) as a coupler which is excited in one or more of its TE or TM modes of resonance including a probe inside the cavity which couples radio frequency waves to the cavity and optionally including a static magnetic field which aids in confining the ions in the coupler and including electrostatic accelerating means (17a) adjacent an opening from the cavity for extracting the ions from said plasma by means of a suitable voltage potential which accelerates the ions from the cavity in an ion stream, wherein the plasma, the opening and ion accelerating means are maintained at a reduced pressure in operation, the improvement which comprises:
    (a) an electrically insulated chamber (15) having a central longitudinal axis in closely spaced relationship to the opening in a hollow metal cavity (11);
    (b) at least one electrically insulated metallic grid means (17a) mounted over the opening and adjacent to and outside the insulated chamber as the electrostatic accelerating means for the ions and which forms part of the microwave cavity;
    (c) gas supply means (18, 19) for providing a gas which is ionized to form the plasma in the insulated chamber, wherein the microwave resonance applied to the cavity and plasma creates and then maintains the plasma in the shape of a disk in the opening adjacent to the grid means and perpendicular and surrounding the axis in the chamber; and
    (d) movable metal plate means (12) in the cavity mounted perpendicular to the axis and movable towards and away from the opening; and
    (e) a movable probe (14) connected to and extending inside the cavity for coupling the radio frequency waves to the cavity, wherein upon movement of the plate means and the probe in the cavity achieves selected TE or TM mode of resonance of the microwave in the cavity and varies the resonance of the mode.

5. The ion source apparatus of claim 4 wherein a magnetic field (26, 27) is mounted on the cavity to aid in reducing diffusion of the plasma from the chamber and in accelerating the ions.

6. The ion source apparatus of claim 4 wherein the grid means includes a first screen grid (17a) adjacent the opening and a second accelerator grid (17b) adjacent the first grid and further away from the opening which is negatively charged and accelerates the ions out of the chamber.

7. The ion source apparatus of claim 4 wherein the ion stream from the grid means is neutralized by electrons from an electron generating neutralizer (20) upon leaving the apparatus.

8. The ion source apparatus of claim 4 as an engine for a space vehicle to be operated in outer space which provides the reduced pressure.

9. The ion source apparatus of claim 4 wherein a vacuum means is attached adjacent the opening to provide the reduced pressure.

10. The ion source apparatus of claim 4 wherein the magnetic field (26, 27) is mounted on and around the cavity and around the plasma disk to provide magnetic cusps which confine the ions in the plasma in the chamber except at the opening.

11. The ion source apparatus of claim 4 wherein the gas supply means is provided as a ring (18) adjacent to and around the opening and in the chamber with holes or a slot for release of the gas around and into the opening.

12. The ion source apparatus of claim 4 wherein a vacuum means (102, 103) provides the reduced pressure and wherein a work stage (35) is provided outside of the apparatus such that the ions or free radicals impinge upon the stage.

13. The method which comprises:
    (a) providing an ion generating apparatus including a plasma source employing a radio frequency wave coupler which is excited in one or more of its TE or TM modes of resonance to produce the plasma in the coupler and optionally including a static magnetic field which aids in confining the ions in the coupler including a probe inside the coupler which couples the radio frequency waves to the coupler and including ion attracting means (17b) for attracting the ions from said plasma by means of a suitable voltage potential which accelerates the ions, wherein the plasma, and ion attracting means are maintained at a reduced pressure in operation wherein the ion source apparatus includes the improvements of:

(1) an electrically insulated chamber (15) having a longitudinal axis and mounted in closely spaced relationship to an area (16) of a metallic radio frequency wave coupler which is in the shape of a hollow cavity;

(2) at least one ion attracting means 17a mounted adjacent to and insulated from the insulated chamber which ion attracting means forms part of the radio frequency wave coupler;

(3) gas supply means (18, 19) for providing a gas which is ionized to form the plasma in the insulated chamber;

(4) movable metal plate means (12) in the cavity mounted perpendicular to the axis and movable towards and away from the plasma disk; and (5) a movable probe (14) connected to and extending inside the coupler for coupling the radio frequency waves to the coupler;

(b) forming the plasma in the chamber with the radio frequency wave at an elevated gas pressure below atmospheric pressure and at elevated gas flow rates from the gas supply means;

(c) reducing the gas pressure and flow rate of the gas into the chamber to provide a plasma disk adjacent the ion attracting means, wherein the radio frequency wave resonance applied to the coupler creates and then maintains the plasma in the shape of an elongate, thin disk adjacent to the ion attracting means and perpendicular and surrounding to the axis in the chamber during steady state operation of the apparatus;

(d) tuning the coupler using the movable plate means by movement towards and away from the plasma disk and by movement of the probe into and out of the coupler, wherein the movement of the plate means and probe in the cavity achieves a selected TE or TM mode of resonance of the cavity and varies the resonance of the mode; and (e) attracting the ions from the plasma with the ion attracting means.

14. The method of claim 13 wherein the ion attracting means is a plate (30) mounted adjacent the chamber and wherein the ions are attracted to the plate.

15. The method of claim 13 wherein a surface of an article to be etched or milled by the ions is provided on a plate (30) adjacent to the chamber which attracts the ions.

16. The method of claim 13 wherein a chemical reaction with a molecule provided in the chamber is initiated by the plasma in the chamber.

17. The method of claim 13 wherein the metallic attracting means is a wire mesh grid (17b) which accelerates the ions outside of the apparatus.

18. The method of claim 13 wherein magnets (26, 27) are provided around the coupler or cavity such that magnetic fields from the magnets form cusps to confine the ions in the chamber.

* * * * *